Figure 1:
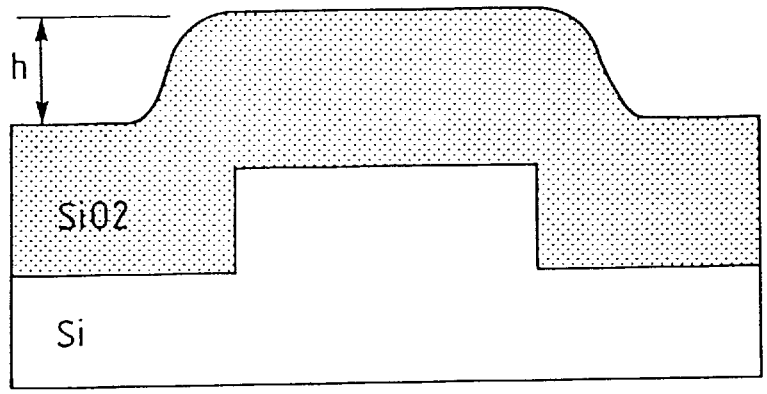

United States Patent [19]
Jacquinot et al.

[11] Patent Number: 6,043,159
[45] Date of Patent: Mar. 28, 2000

[54] CHEMICAL MECHANICAL POLISHING PROCESS FOR LAYERS OF ISOLATING MATERIALS BASED ON SILICON DERIVATIVES OR SILICON

[75] Inventors: Eric Jacquinot, Trosly Breuil; Maurice Rivoire, Meylan, both of France

[73] Assignee: Clariant Chimie S.A., Puteaux, France

[21] Appl. No.: 08/941,188

[22] Filed: Sep. 30, 1997

[30] Foreign Application Priority Data

Oct. 23, 1996 [FR] France .................................. 96 12892

[51] Int. Cl.⁷ ................................................ H01L 21/304
[52] U.S. Cl. ................................ 438/693; 216/38; 216/89
[58] Field of Search ..................................... 438/691, 692, 438/693; 216/38, 52, 89

[56] References Cited

U.S. PATENT DOCUMENTS

| | | |
|---|---|---|
| 4,689,656 | 8/1987 | Silvestri et al. ................... 438/429 |
| 4,944,836 | 7/1990 | Beyer et al. ....................... 438/692 |
| 5,480,476 | 1/1996 | Cook et al. . |
| 5,525,191 | 6/1996 | Maniar et al. ..................... 438/693 |
| 5,527,423 | 6/1996 | Neville et al. ..................... 438/693 |
| 5,575,837 | 11/1996 | Kodama et al. .................... 438/693 |
| 5,769,689 | 6/1998 | Cossaboon et al. ................. 51/308 |

FOREIGN PATENT DOCUMENTS 0 401 147  12/1990  European Pat. Off. ...... H01L 21/302

*Primary Examiner*—Benjamin Utech
*Assistant Examiner*—Duy-Vu Deo
*Attorney, Agent, or Firm*—Browdy and Neimark

[57] ABSTRACT

Process for the chemical mechanical polishing of a layer of isolating material based on silicon or a silicon derivative, in which abrasion of the layer of isolating material is carried out by rubbing said layer using a fabric which brings into play an abrasive containing an acid aqueous solution of colloidal silica containing individualized colloidal silica particles, not linked together by siloxane bonds, and water as the suspension medium and new abrasives based on such suspensions.

19 Claims, 1 Drawing Sheet

CHEMICAL MECHANICAL POLISHING PROCESS FOR LAYERS OF ISOLATING MATERIALS BASED ON SILICON DERIVATIVES OR SILICON

The present invention relates to a planarization technique by chemical mechanical polishing of an electrical isolation material applicable to the isolation of integrated circuits.

Within the context of the reduction in dimensions and the increase in density in the field of micro-electronics, isolation techniques are evolving. Therefore, the techniques for the isolation of active zones based on localized oxidation have been succeeded by the lateral isolation techniques of said active zones by shallow trench isolation including stages for etching these trenches, for filling with a deposit of nonconducting material and planarization of this isolating layer.

The main difficulty associated with these isolation techniques is the planarization of the nonconducting material layer.

It appears that chemical mechanical polishing is the most effective solution for this stage of the planarization process. It has the advantage relative to conventional liquid or laser etching techniques, of etching the materials while very effectively planarizing the initial reliefs.

The present invention relates to an improvement of the stages for planarizing the silicon oxide used for the production of integrated circuits as regards lateral isolation (STI: Shallow Trench Isolation) and as regards the isolation of interconnections (ILD, Inter-Level Dielectrics).

The chemical mechanical polishing technique combines two effects which have an influence on the attack of the nonconducting material, namely, a mechanical effect and a chemical effect.

The mechanical effect results from the load force of the wafer of semiconductor material on a polishing fabric, relative displacement speeds (for example of rotation) of the wafer and the fabric, the characteristics of this fabric and of the diameter of the silica particles in the abrasive.

The chemical effect results essentially from the surface chemistry of the colloidal silica.

The two combined effects cause the molecules of the polished material to retreat preferentially over the raised zones by inducing planarization of the material to be polished.

In order to polish a nonconducting material based on silicon derivatives such as silicon dioxide or silicon nitride, an abrasive is generally used which is constituted by basic aqueous solutions of colloidal particles of pyrogenic silica, also called fumed silica.

These pyrogenic silicas are obtained via pyrogenic processes by combustion of high purity tetrachlorosilane with hydrogen and oxygen in a combustion chamber at high temperature.

Generally primary particles of spherical silica of 5 to 50 nanometers are obtained which form particle aggregates of a length generally comprised between 50 and 500 nanometers.

In the literature, it is described that, during the chemical mechanical polishing of a nonconducting material based on silicon derivatives, in particular based on silicon dioxide, the rate of attack of the nonconducting material using pyrogenic silicas was higher the larger the diameter of the particles of pyrogenic silica was and the higher the pH of the colloidal silica solution used was (see in particular R. Jairath et al., Mat; Res. Soc. Symp. Proc. vol 337, 1994, p. 121–31, G. J. Pietsch et al., Surface Science 331–333 (1995) p.395–401, M. Borda et al., Dumic Conference 21–22, 2, 1995, p. 331–337, D. DeVieger et al., Conference Proceedings ULSI-X, 1995, Materials Research Society, p. 201–205, W. J. Patrick et al., J. Electrochem. Soc., vol. 138, No. 6, June 1991, p. 1778–1784, R. Kolenkow et al., Solid State Technology, June 1992, p.112–114, Beyer, Klaus Dietrich EP 224646, Sears George Wallace Jr, U.S. Pat. No. 3,922,393, Doan Trung T. U.S. Pat. No. 5,169,491, Koto ltsuki JP 07316846).

The most commonly used pHs are situated between 9 and 12.5. On the other hand at acid pH the rates of attack are particularly low, see in particular FIG. 1 of the article by G. J. Pietsch et al, Surface Science 331–333 (1995) p.396.

The use of such aqueous suspensions in a highly basic medium presents a certain number of drawbacks. Firstly, due to the wide distribution in the length of the aggregates, there is a tendency to sedimentation of the latter over time, a drawback which can only be minimized by constant agitation of the suspension. Moreover, the use of highly basic aqueous suspensions always presents drawbacks as regards the environment and working conditions.

The main aim of the Applicant is therefore an improvement in the planarization of silicon dioxide layers in the isolation processes which may be encountered in the production of integrated circuits, for example, in the lateral isolation processes by shallow trenches of future active zones of the semiconductor substrate, as well as in other isolation processes of integrated circuits which require a perfect planarization of the silicon dioxide. This also includes the isolation of interconnections of integrated circuits by silicon dioxide.

In order to realise all these improvements in the chemical mechanical polishing with basic aqueous suspensions of colloidal silica, it was noted in a surprising and unexpected fashion that suspensions of colloidal silica, containing or constituted by individualized fine particles of silica not linked together by siloxane bonds and used in acid medium would allow much improved planarization effects to be obtained while retaining a good rate of attack of the isolating material as well as excellent qualities of uniformity of attack of the polishing.

This is why a subject of the present invention is the use of an abrasive which includes an acid aqueous suspension of colloidal silica containing individualized colloidal silica particles, not linked together by siloxane bonds, and water as the suspension medium for the chemical mechanical polishing of layers based on silicon or silicon derivatives, more particularly the chemical mechanical polishing of layers of silicon dioxide, as well as a process for the chemical mechanical polishing of a layer of isolating material based on silicon or a silicon derivative, in which an abrasion of the layer of isolating material is carried out by rubbing said layer using a fabric which includes an abrasive, characterized in that the abrasive contains an acid aqueous suspension of colloidal silica containing individualized particles of colloidal silica, not linked together by siloxane bonds, and water as the suspension medium and preferably is essentially constituted by such an acid aqueous suspension.

These aqueous suspensions of colloidal silica contain or are constituted by individualized fine silica particles, not linked together by siloxane bonds, in suspension in water and are preferably substantially free from particle aggregates. For the chemical mechanical polishing of layers of material according to the invention, the aqueous suspensions of colloidal silica are used in acid medium and preferably have individual particle diameters comprised between 3 and 250 nm, in particular between 3 and 150 nm, particularly between 10 and 50 nm.

Such aqueous suspensions of colloidal silica can be obtained, either from alkaline silicates, in particular, sodium or potassium, or from ethyl silicate. In both cases, using means known to a person skilled in the art and more particularly described by K. K. Iler, in "The Chemistry of Silica", chapter 9, pages 331 to 343, Publisher Wiley Interscience 1979, acid aqueous suspensions of colloidal silica can be obtained containing individualized particles, not linked together by siloxane type bonds, with a diameter comprised between 3 and 250 nm.

A principal advantage of the invention is the improvement in the chemical mechanical polishing of layers of isolating material such as silicon dioxide by acid aqueous suspensions of colloidal silica.

For example, this improvement can essentially be demonstrated by 3 types of tests:

a) tests of the rate of attack of the silicon dioxide layers by the abrasive aqueous dispersion of colloidal silica. This rate of attack is measured by the difference in thickness measurements before and after polishing, on a silicon dioxide wafer/slice free of patterns. The rate of attack is expressed in Å/min.

b) planarization tests, in particular the degree of planarization (DP) characterizing the variation in the height of step between the initial relief (before polishing) and the final relief (after polishing), measured on the wafers/slices containing isolated patterns of an initial height of 7000Å. It is expressed as a percentage and is defined by the following formula:

$$DP = 100 \times \frac{Hi - Hf}{Hi}$$

with Hi=initial height of step

Hf=final height of step

A total planarization gives a total degree of planarization of 100%. A nil planarization gices a degree of planarization of 0%.

Figure 2:
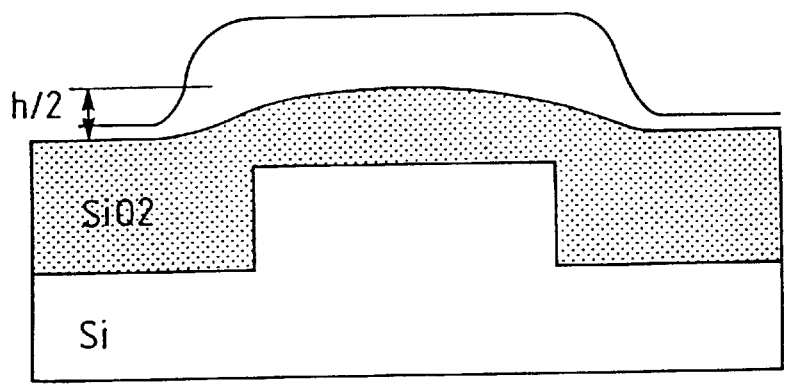
Figure 3:
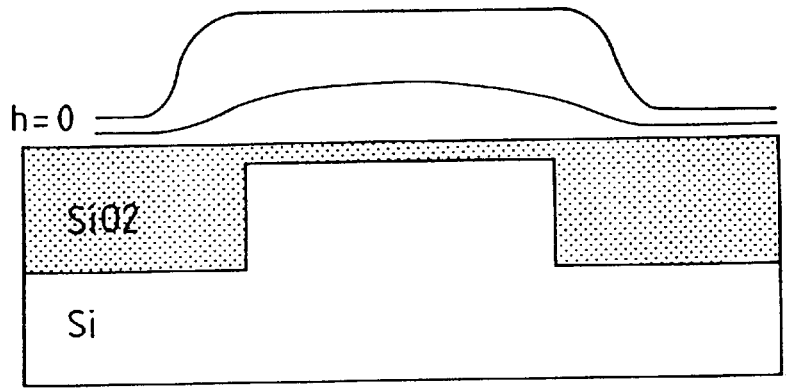

FIGS. 1, 2 and 3 illustrate the definition of the degree of planarization. The degree of planarization is 0% in FIG. 1, 50% in FIG. 2 and 100% in FIG. 3.

For all the planarization tests, the thickness removed in the low parts (outside the pattern) were adjusted to 3500 Å.

c) tests of the uniformity of attack of the polishing. This represents the variation in thickness of the oxide on the same wafer. It is calculated from measurements of the oxide on the same $SiO_2$ wafer before and after polishing according to the following formula:

$$U = \frac{\text{Max thickness} - \text{Min thickness}}{2 \times \text{Average thickness removed}} \times 100$$

The lower the value obtained the more the uniformity of attack is satisfactory. This advantageous polishing process is carried out thanks to acid aqueous suspensions of particular colloidal silica, constituted by individualized particles, not linked together by siloxane bonds.

Under the preferred conditions for implementing the process according to the invention, to acid aqueous suspensions of colloidal silica are used having a pH comprised between 1 and 6, in particular between 1.5 and 4, particularly between 2 and 3.

Under other preferred conditions for implementing the process according to the invention, the diameters of the elementary particles of the colloidal silica suspensions are comprised between 3 and 250 nm, in particular between 3 and 150 nm, particularly between 10 and 50 nm.

In order to obtain the best polishing efficiency in particular for the two main retained tests: rate of attack of silicon dioxide layers and quality of planarization of treated layers, under yet other preferred conditions of implementation, the concentration by weight of the polishing product, i.e. silica, is from 5 to 50%, preferentially from 15 to 30%.

The layer of isolating material is preferably based on silicon dioxide, silicon nitride, polysilicon or amorphous silicon and more particularly based on silicon dioxide.

Another advantage of the invention is that the acid aqueous suspensions of colloidal silica, constituted by individualized particles, not linked together by siloxane bonds and having practically monodispersed particle diameters, have a very good stability over time which results in a lack of sedimentation as time passes.

Finally, a subject of the present invention is an abrasive for the chemical mechanical polishing of a layer of isolating material based on silicon or a silicon derivative containing a fabric impregnated with an acid aqueous suspension of colloidal silica, containing individualized particles not linked together by siloxane bonds, with a diameter comprised between 3 and 250 nanometers, of pH comprised between 1.5 and 4. The suspensions which are quite particularly preferred are described below in the operating conditions of the process.

The following examples allow the invention to be better understood.

EXAMPLE 1

Example of polishing with abrasives based on acid aqueous suspensions of colloidal silica according to the invention.

A deposit of silicon dioxide of approximately 1 μm is produced on each studied wafer which is then measured before polishing.

The wafer is then polished according to the following standard process:

| | |
|---|---|
| load force: | 0.5 daN/cm$^2$ |
| plate speed: | 25 revs/min |
| carrier speed | 22 revs/min |
| temperature: | 20° C. |
| abrasive throughput: | 80 cm$^3$/min |
| fabric: | IC 1000 on Suba 4 from RODEL PRODUCTS |

The results indicated in each example are obtained from a full silicon dioxide wafer for the rates of attack and for the percentage uniformity of attack and a structured wafer for the determination of the degree of planarization.

With a colloidal silica the characteristics of which are as follows:

| | |
|---|---|
| average diameter of the elementary particles of colloidal silica | 12 nm |
| pH of aqueous suspension | 2.2 |
| concentration by weight of colloidal silica the following are obtained: | 20% |
| degree of planarization of 78% | |
| rate of attack of SiO$_2$ of 1050 Å/min | |
| percentage uniformity of attack of 3%. | |

Under the same conditions using a colloidal silica the characteristics of which are as follows:

| | |
|---|---|
| average diameter of the elementary particles of colloidal silica | 25 nm |
| pH of aqueous suspension | 2.2 |
| concentration by weight of colloidal silica | 20% |
| the following are obtained: | |
| degree of planarization of 52% | |
| rate of attack of $SiO_2$ of 1850 Å/min | |
| percentage uniformity of attack of 2.5%. | |

Experiment 1

Comparison example of polishing with abrasives based on basic aqueous suspensions of colloidal silica.

The polishing process is carried out under the above conditions but the concentration by weight of silica was adjusted to 12–13%.

With a commercial pyrogenic colloidal silica for this application the characteristics of which are as follows:

| | |
|---|---|
| average diameter of elementary particles | 10 nm |
| average diameter of aggregate particles | 150 nm |
| pH of aqueous suspension | 10.3 |
| concentration by weight of active product | 12% |
| the following are obtained: | |
| degree of planarization of 42% | |
| rate of attack of $SiO_2$ of 1100 Å/min | |
| percentage uniformity of attack of 8.5%. | |

With a commercial pyrogenic colloidal silica for this application the characteristics of which are as follows:

| | |
|---|---|
| average diameter of elementary particles | 25 nm |
| average diameter of aggregate particles | 200 nm |
| pH of aqueous suspension | 10.2 |
| concentration by weight of active product | 13% |
| the following are obtained: | |
| degree of planarization of 56% | |
| rate of attack of $SiO_2$ of 1500 Å/min | |
| percentage uniformity of attack of 11.5%. | |

Therefore, it is noted that, on the one hand, contrary to what is indicated in the literature, and in an unexpected fashion, rates of attack of the silicon oxide layer can be obtained with acid aqueous suspensions of colloidal silica which are of the same order of size as with the basic aqueous suspensions of colloidal silica used previously.

On the other hand, it can also be seen that in an equally unexpected fashion, the acid aqueous suspensions of colloidal silica produce planarization effects very considerably superior to those obtained with basic aqueous suspensions of pyrogenic colloidal silica and that in a very surprising fashion it is the acid aqueous suspensions based on small particles which produce the best results of all the products tested.

Finally, a very good uniformity of attack of the acid aqueous suspensions of colloidal silica according to the invention can be revealed relative to basic aqueous suspensions of pyrogenic colloidal silica.

We claim:

1. Chemical mechanical polishing process for a layer of isolating material based on silicon or a silicon derivative, in which an abrasion of the isolating material layer is carried out by rubbing said layer using a fabric containing an abrasive, characterized in that the abrasive contains an acid aqueous suspension of colloidal silica containing individualized colloidal silica particles, not linked together by siloxane bonds, and water as the suspension medium.

2. Process according to claim 1, characterized in that the acid aqueous suspension of colloidal silica has a pH between 1 and 6.

3. Process according to claim 2, characterized in that the acid aqueous suspension of colloidal silica has a pH between 2 and 3.

4. Process according to claim 3, characterized in that the acid aqueous suspension of colloidal silica contains individualized particles not linked together by siloxane bonds, with a diameter comprised between 3 and 250 nanometers.

5. Process according to claim 4, characterized in that the acid aqueous suspension of colloidal silica contains individualized particles not linked together by siloxane bonds, with a diameter between 10 and 50 nanometers.

6. Process according to claim 5, to characterized in that the acid aqueous suspension of colloidal silica is used at a concentration by weight of silica between 5 and 50%.

7. Process according to claim 6, characterized in that the acid aqueous suspension of colloidal silica is used at a concentration by weight of silica between 15 and 30%.

8. Process according to one of claim 7, characterized in that the layer of isolating material based on silicon or silicon derivatives is based on silicon dioxide, silicon nitride, polysilicon or amorphous silicon.

9. Process according to claim 8, characterized in that the layer of isolating material is based on silicon dioxide.

10. Process according to claim 2, characterized in that the acid aqueous suspension of colloidal silica contains individualized particles not linked together by siloxane bonds, with a diameter between 3 and 250 nanometers.

11. Process according to claim 10, characterized in that the acid aqueous suspension of colloidal silica contains individualized particles not linked together by siloxane bonds, with a diameter between 10 and 50 nanometers.

12. Process according to claim 11, characterized in that the acid aqueous suspension of colloidal silica is used at a concentration by weight of silica between 15 and 30%.

13. Process according to claim 12, characterized in that the layer of isolating material is based on silicon dioxide.

14. Process according to claim 1, characterized in that the acid aqueous suspension of colloidal silica contains individualized particles not linked together by siloxane bonds, with a diameter between 3 and 250 nanometers.

15. Process according to claim 14, characterized in that the acid aqueous suspension of colloidal silica contains individualized particles not linked together by siloxane bonds, with a diameter between 10 and 50 nanometers.

16. Process according to claim 1, characterized in that the acid aqueous suspension of colloidal silica is used at a concentration by weight of silica between 5 and 50%.

17. Process according to claim 16, characterized in that the acid aqueous suspension of colloidal silica is used at a concentration by weight of silica between 15 and 30%.

18. Process according to claim 1, characterized in that the layer of isolating material based on silicon or silicon derivatives is based on silicon dioxide, silicon nitride, polysilicon or amorphous silicon.

19. Process according to claim 18, characterized in that the layer of isolating material is based on silicon dioxide.

* * * * *